United States Patent [19]

Mueller

[11] Patent Number: 4,934,160
[45] Date of Patent: Jun. 19, 1990

[54] EVAPORATOR, ESPECIALLY FOR DISCHARGING WASTE HEAT

[75] Inventor: Robert Mueller, Moordeich, Fed. Rep. of Germany

[73] Assignee: ERNO Raumfahrttechnik GmbH, Bremen, Fed. Rep. of Germany

[21] Appl. No.: 323,439

[22] Filed: Mar. 14, 1989

[30] Foreign Application Priority Data

Mar. 25, 1988 [DE] Fed. Rep. of Germany ....... 3810128

[51] Int. Cl.⁵ ............................................. F25B 39/02
[52] U.S. Cl. ...................................... 62/515; 122/366; 165/41; 165/104.26
[58] Field of Search ............................ 165/41, 104.26; 122/366; 62/515

[56] References Cited

U.S. PATENT DOCUMENTS

| | | | |
|---|---|---|---|
| 3,481,439 | 12/1969 | Finkin | 165/104.26 |
| 4,058,159 | 11/1977 | Iriarte | 165/104.26 |
| 4,058,160 | 11/1977 | Corman et al. | 165/104.26 |
| 4,470,451 | 9/1984 | Alario et al. | 165/104.26 |
| 4,616,699 | 10/1986 | Grote | 165/104.26 |
| 4,685,512 | 8/1987 | Ebelstein et al. | 165/104.26 |

FOREIGN PATENT DOCUMENTS 3526574 3/1987 Fed. Rep. of Germany.

Primary Examiner—Ronald C. Capossela
Attorney, Agent, or Firm—W. G. Fasse; D. H. Kane, Jr.

[57] ABSTRACT

An evaporator for discharging waste heat, for example from a space craft, uses at least one working fluid that is changed from its liquid state to its vapor state. The evaporator has at least one, preferably several, evaporator elements forming a unit. Each element has a liquid space separated from a vapor space by a tubular capillary separation member. The vapor space is divided into primary channels extending in parallel to the separation member. Secondary channels are formed in wall surfaces of the vapor space facing the separation member. The primary and secondary channels communicate with each other and extend approximately perpendicularly to each other. The secondary channels have a cross-sectional flow area which is substantially smaller than the cross-sectional flow area of the primary channels.

13 Claims, 2 Drawing Sheets

EVAPORATOR, ESPECIALLY FOR DISCHARGING WASTE HEAT

FIELD OF THE INVENTION

The invention relates to an evaporator, especially for discharging waste heat, for example, from a space craft or space station.

BACKGROUND INFORMATION

Evaporator units transfer a working fluid from its liquid state into the vapor state. Such units are needed, for example, in space craft and space stations for discharging of waste heat. Such evaporator units have at least one evaporating element in which a liquid containing space is separated from a vapor or steam containing space by a separation element that is constructed as a capillary structure. These evaporators are known as so-called capillary evaporators. Capillary evaporators are intended, especially for use in space flight applications, for example, in space platforms and reusable transport systems such as a space shuttle system.

Waste heat is generated in all space flight bodies due to the energy conversion resulting from the propulsion, the control, the signal processing, and due to experiments as well as due to metabolic processes. The generation of waste heat cannot be avoided due to the limited thermo-dynamic efficiency of the systems involved. The so generated waste heat must be discharged in such a manner that an undesirable heat-up of the space craft or space station is avoided. For accomplishing this purpose it is necessary to transport the waste heat within the space craft or station from a point where the waste heat is generated to a point suitable for discharging the waste heat into the environment of the space craft or station. The transport of the waste heat between its point of generation and a distant heat sink by means of a closed fluid circulating circuit and the direct discharge of heat by an evaporating working fluid enable the desired temperature control. The first type of system in which heat is transported from its source to a heat sink, are is referred to as so-called transport systems. The second type of system in which heat is discharged by the evaporation of a working fluid, is referred to as so-called discharge systems. The transport systems are primarily useful for larger orbital stations. The discharge systems are primarily useful in so-called "space transports" such as a space shuttle.

Both systems have a common feature in that they require an evaporator unit for the heat discharge. The trouble-free proper operation of such an evaporator unit requires that two conditions are satisfied. The first condition requires that the heated surfaces are wetted at all times with the working fluid to be evaporated, for example water or ammonia. The second condition requires that the liquid phase is effectively separated from the vapor phase in the evaporator unit.

The above conditions are satisfied in evaporators working on earth, by the gravity effect under which such an evaporator is working. However, the effects of gravity cannot be relied on when such evaporators are used in outer space where an external acceleration force is either entirely absent, such as in an orbital station, or such acceleration force changes in its size and effective direction as is the case in a space transport or space shuttle system. For this reason the above mentioned capillary evaporators have been used in space craft as evaporator units forming part of the evaporation systems. These evaporator units make use of the capillary principle in which capillary elements function as a quasi-wick. Due to the effect of the wick, the liquid and the vapor are separated from each other in such evaporator units. The capillary structure for this purpose is part of a so-called separator element and the heat is conducted through a special arrangement of ribs through the vapor space to the vapor facing surface of the capillary structure functioning as a wick. Due to the capillary forces the wick is saturated with the working fluid at all times. These capillary forces simultaneously make sure that the mass flow of the working fluid necessary for the cooling effect, adjusts itself automatically.

OBJECTS OF THE INVENTION

In view of the foregoing it is the aim of the invention to achieve the following objects singly or in combination:

to construct an evaporator unit of the type described above in such a way that it assures an optimal heat discharge;

to make sure that the evaporator unit requires a small structural volume and a small weight while nevertheless assuring a very large heat transfer coefficient to thereby improve the efficiency of such evaporators; and to provide separator elements which are suitable for use in a closed circulating circuit or cycle or in an open cycle arrangement.

SUMMARY OF THE INVENTION

According to the invention the above objectives have been achieved in that the vapor space is constructed in the form of primary channels which are arranged alongside of a tubular separation element. Secondary channels are arranged in the surfaces of the vapor space that face the separation element. The secondary channels and the primary channels are connected to communicate with each other. Further, the secondary channels extend approximately perpendicularly to the primary channels and vice versa.

This arrangement according to the invention has the advantage that the heat transfer surface area is maximized so that simultaneously a large heat transfer coefficient is achieved. Another advantage of the structure according to the invention is seen in that on the vapor side a low pressure loss is achieved so that the evaporation temperature is substantially constant in the axial direction. The invention achieves an especially high efficiency in the order of 100% evaporation of liquid evaporant. An especially good efficiency is achieved if a larger number of tubular evaporating elements are assembled in a parallel arrangement. According to a further embodiment which is particularly suitable for use in orbital stations, the tubular evaporator elements are assembled in a plate-like structure which functions as a heat exchanger plate in a closed two-phase circulating system or cycle.

The present exchanger can be operated in a closed circulating system or in an open circulating system. The closed circulating system is especially suitable for orbital platforms or space stations while the open circulating system is especially suitable for use in a space transporter, such as a space shuttle.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1A:
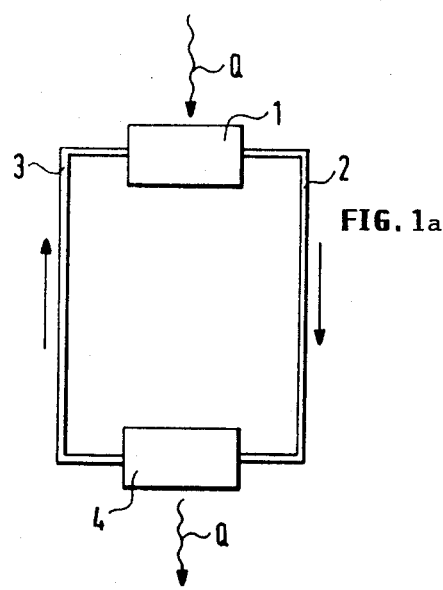
FIG. 1a illustrates in block form an evaporator operating as a so-called closed circulating circle or cycle system.
Figure 1B:
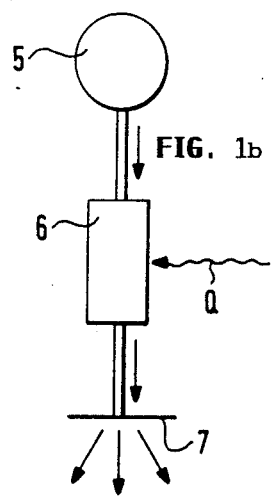
FIG. 1b shows in block form an evaporator operating as a so-called open cycle system.

FIGS. 1a and 1b show the basic construction of two systems for the discharge of waste heat. Each of these systems is suitable for use in a space craft or in a space station since it uses so-called capillary evaporator elements. FIG. 1a shows a closed circulatory circuit or system in which the waste heat is discharged by means of a heat transport. FIG. 1b shows a open circuit in which the working fluid is continuously supplied and discharged in the form of a vapor.

Referring more specifically to FIG. 1a, a heat source Q provides waste heat to an evaporator unit 1 which is connected by a closed pipe system 2, 3 to a condenser 4. Thus, the working fluid circulates through the pipe 2 from the evaporator unit 1 to the condenser 4 and from the latter through the pipe 3 back to the evaporator unit 1. The condenser 4 condenses the vapor and the thus liberated energy in the form of condensation heat is discharged to the environment or to a heat sink. The now condensed fluid passes back as liquid through the pipe 3 into the evaporator 1. The evaporator unit 1 comprises a capillary structure functioning as a pump for the working fluid in this system.

In the so-called open system of FIG. 1b, the working fluid is continuously supplied into a storage container 5 which in turn supplies the working fluid to the evaporator unit 6 which converts the fluid into vapor or steam thereby using the waste heat Q supplied to the evaporator 6. The evaporator 6 has an outlet opening 7 through which the vapor is discharged to the environment. In this embodiment the capillary structure contained in the evaporator unit 6 functions as a quasi-retaining membrane.

Figure 2:
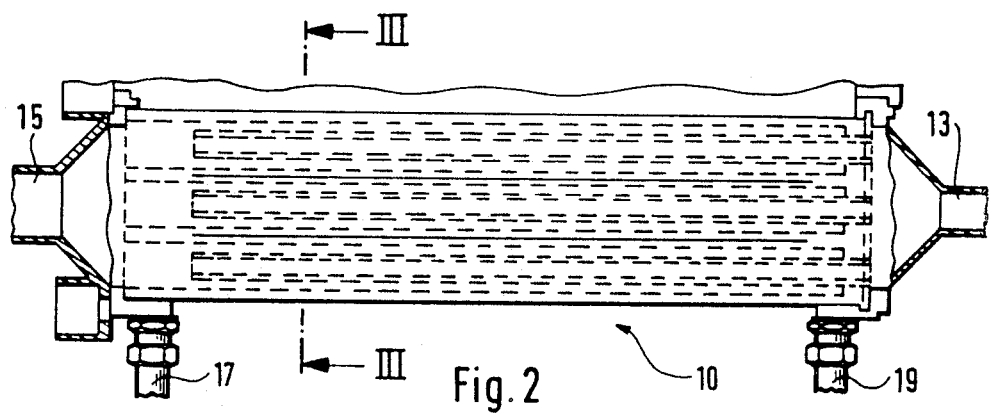
FIG. 2 is a longitudinal section through an evaporator unit according to the invention.
Figure 3:
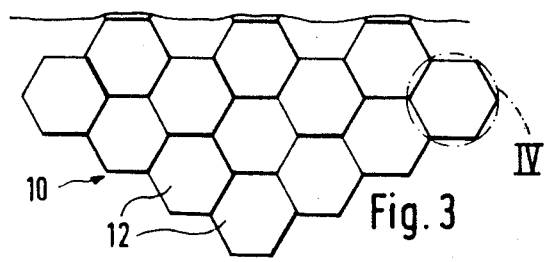
FIG. 3 is a partial sectional view along section line III—III in FIG. 2 on an enlarged scale compared to FIG. 2.

FIGS. 2 and 3 illustrate an evaporating device comprising a plurality of evaporating units 10 arranged in parallel to each other. Each unit 10 in turn comprises a plurality of evaporizing elements 12. Each evaporizing element 12 has a hexagonal cross-sectional shape and is also arranged in parallel with all the other elements 12. The hexagonal cross-section assures the maximum packing density of the elements 12 within the device 10.

Figure 4:
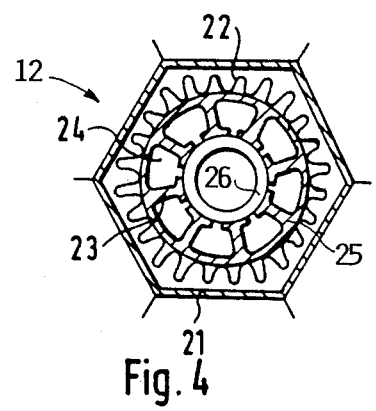
FIG. 4 is an enlarged view of the detail encircled at IV in FIG. 3.
Figure 5:
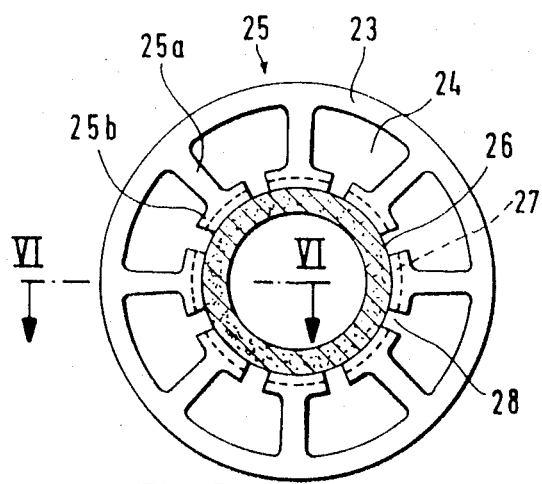
FIG. 5 is a further enlarged view similar to that of FIG. 4, but showing the internal portion of FIG. 4.
Figure 6:
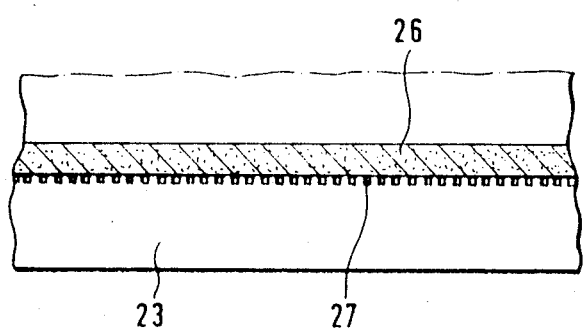
FIG. 6 is an enlarged view along section line VI—VI in FIG. 5, whereby the view is rotated by 90°.

As shown in FIG. 2, each evaporator device or unit 10 has an inlet 13 for a first working fluid, for example water, and an outlet 15 for the vapor produced in the evaporating elements 12. The waste heat is supplied in the form of a second working fluid flowing into an inlet port 17 and out again through an outlet port 19 after the waste heat has been used for the evaporation of the first working liquid. Referring to FIGS. 3 and 4, each evaporating element 12 has a hexagonal outer wall 21 and an inner capillary tube 26. In the space between the outer wall 21 and the capillary tube 26 there are arranged, radially inwardly, first a plurality of corrugated ribs 22, then a tubular member 25 having an outer wall 23 carrying ribs 22. The tubular member 25 in turn has axially and radially in spokes 25a, see FIG. 5. Each spoke 25a has a foot 25b resting on the capillary inner tube 26 as best seen in FIG. 5. The spokes 25a extend between the outer wall 23 of the tubular member 25 and the outer surface of the capillary tube 26 and substantially along the length of the respective unit 10 as shown in dashed lines in FIG. 2. Primary vapor channels 24 are defined between neighboring spokes 25a. The feet 25b of all the spokes 25a form pipe segments which rest with an intimate thermal contact on the outer surface of the capillary tube 26 due to a shrink fitting attachment of the tubular member 25 to the capillary tube 26. Secondary channels 27 are formed in the inner surface of the feet or pipe segments 25b. The cross-sectional flow area of the secondary channels 27 is substantially smaller than the cross-sectional flow area of the primary channels 24. The secondary channels 27 extend along a spiral path around the outer surface of the capillary tube 26. The secondary channels 27 are also visible in FIG. 6. The secondary channels 27 extend in the feet 25b of the spokes 25a. The primary channels 24 open downwardly into grooves 28 between neighboring feet 25b so that the primary channels 24 directly communicate through these grooves 28 with the secondary channels 27 in the immediate vicinity of the capillary tube 26 for an efficient vapor removal.

The capillary tube 26 is made of sinter aluminum tube 26. Due to the capillary forces the wall of the capillary tube 26 continuously functions as a wick so that the first working fluid keeps the capillary tube wetted.

As mentioned, the waste heat to be discharged is supplied by means of a second working fluid which flows between the outer hexagonal wall 21 and the ribs 22 of each evaporating element 12. The vapor generated when the first working fluid exits out of the capillary pipe 26, is guided through the relatively fine secondary channels 27 to the primary channels 24 for the discharge or vapor. The primary channels 24 are all connected to communicate with the discharge port 15 so that the generated vapor may be discharged through the exit port 15.

Figure 7:
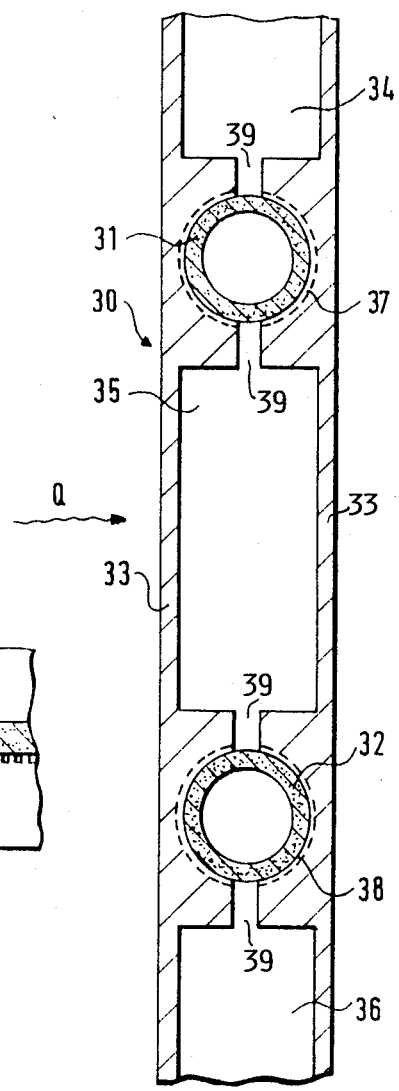
FIG. 7 shows by embodiment comprising several evaporator elements integrated into a plate-type heat exchanger evaporator unit.

FIG. 7 illustrates a second embodiment of an evaporating unit 30 according to the invention, constructed as a heat exchanger plate Several capillary pipes 31, 32 are arranged in parallel to one another between two plate-like members 33, 33a. The first working fluid is inside the capillary pipes 31, 32. Primary channels 34, 35, 36 extend between neighboring capillary tubes 31, 32. The primary channels 34, 35, and 36 for the discharge of vapor communicate directly with the surface of the capillary pipes 31, 32 through grooves or ducts 39. These ducts 39 have a reduced cross-sectional area compared to the primary channels 34, 35, 36. Each capillary pipe 31, 32 is surrounded by spiral grooves forming secondary channels 37, 38. These secondary spiral channels 37, 38 communicate through the grooves or ducts 39 and thus with the primary channels 34, 35, 36 for an efficient vapor removal.

The operation or function of the embodiment of FIG. 7 corresponds substantially to the above described function of the embodiment shown in FIGS. 2 to 6. However, in the embodiment of FIG. 7, the use of a second working fluid is not required because the waste heat to be discharged is conducted directly into the plates 33, 33a for discharge to the environment.

The embodiment of FIGS. 2 to 6 is primarily suitable for an open evaporation cycle. The embodiment of FIG. 7 on the other hand is primarily suitable for a closed two-phase circulatory systems. Thus, the second embodiment is particularly suitable, for example, for use in orbital platforms.

Although the invention has been described with reference to specific example embodiments, it will be appreciated that it is intended to cover all modifications and equivalents within the scope of the appended claims.

What is claimed is:

1. An evaporating apparatus for transferring a working fluid from its liquid state into its vapor state, especially for systems for discharging of waste heat from a space flight body, comprising at least one vaporizing unit having at least one vaporizing element enclosing a liquid space for holding an evaporable working fluid and a vapor space wherein said evaporable working fluid is evaporated, capillary separation means for separating said liquid space from said vapor space and for passing said evaporable working fluid by capillary action from said liquid space to said vapor space, first means forming primary channels in said vapor space, said primary channels being arranged along said capillary separation means, second means forming secondary channels in surfaces of walls of said vapor space facing said capillary separation means, and hollow third means for communicating said secondary channels with said primary channels through said hollow third means for an efficient vapor removal from said vapor space, said primary and secondary channels extending approximately perpendicularly to each other and means for applying heat to evaporate said evaporable working fluid.

2. The evaporating apparatus of claim 1, wherein said secondary channels have a spiral configuration.

3. The evaporating apparatus of claim 1, wherein said first means for forming said primary channels comprise a tubular member, wherein said second means for forming said secondary channels are surrounded by said tubular member, said first means further comprising radially extending spoke type walls and pipe segments forming feet for said spoke type walls to rest on an outer surface of said capillary separation means, whereby said first means form a ring structure concentrically surrounding said capillary separation means.

4. The evaporating apparatus of claim 3, wherein said means for applying heat comprise a corrugated pipe having corrugations forming longitudinal ribs resting on an outer surface of said ring structure which supports said corrugated pipe.

5. The evaporating apparatus of claim 4, wherein said means for applying heat further comprise outer housing means surrounding said corrugated pipe, said outer housing means comprising an outer pipe spaced from said corrugated pipe for forming an further space between said outer pipe and the corrugated pipe for holding a heat supplying working fluid supplying said heat.

6. The evaporating apparatus of claim 5, wherein the outer pipe forming said housing has a hexagonal cross-sectional configuration.

7. The evaporating apparatus of claim 1, wherein several evaporating elements are assembled to form an evaporator unit, said evaporator unit comprising inlet port means and outlet port means communicating with all evaporator elements of said evaporator unit for admitting and discharging said evaporable working fluid, said means for applying heat comprising inlet and outlet ports for a heat supplying working fluid.

8. The evaporating apparatus of claim 1, wherein said first means forming said primary channels comprise two plate members, said second means comprising at least two evaporating elements assembled between said two plate members for forming a plate-type evaporator unit.

9. The evaporating apparatus of claim 1, wherein said capillary separation means comprise a capillary separating element formed of a metallic sinter material for achieving a capillary pump action.

10. The evaporating apparatus of claim 1, wherein said secondary channels have a cross-sectional flow area which is substantially smaller than a cross-sectional flow area of said primary channels.

11. The evaporating apparatus of claim 1, wherein said capillary separation means comprise a capillary separation element made of a synthetic material, such as PTFE for generating a capillary retaining force.

12. The evaporating apparatus of claim 1, wherein said capillary separation means comprise a capillary separation element coated on its surface facing the vapor, with a synthetic material such as PTFE for producing a capillary retaining force.

13. The evaporating apparatus of claim 9, wherein said metallic sinter material is sinter aluminum.

* * * * *